United States Patent [19]

Carrillo et al.

[11] 4,178,678

[45] Dec. 18, 1979

[54] APPARATUS AND METHOD FOR AFFIXING BONDABLE FINGER CONTACTS TO A PRINTED CIRCUIT BOARD

[75] Inventors: Leo Carrillo, Denver; Thomas C. Madden, Boulder, both of Colo.

[73] Assignee: Bell Telephone Laboratories, Incorporated, Murray Hill, N.J.

[21] Appl. No.: 891,039

[22] Filed: Mar. 28, 1978

[51] Int. Cl.² .................... B41M 3/08; H01R 43/00; B32B 31/00

[52] U.S. Cl. .................................. 29/625; 29/628; 156/265; 156/267; 156/517

[58] Field of Search ............... 156/256, 264, 265, 267, 156/517; 29/625, 630 B, 626, 628, 564.6, 568, 739

[56] References Cited

U.S. PATENT DOCUMENTS

| | | | |
|---|---|---|---|
| 3,396,461 | 8/1968 | Spooner et al. | 29/630 |
| 3,704,515 | 12/1972 | Nelson | 29/626 |
| 3,938,246 | 2/1976 | Over et al. | 29/628 |
| 4,012,835 | 3/1977 | Wallick | 29/628 |
| 4,044,201 | 8/1977 | Wallick | 174/52 |
| 4,044,460 | 8/1977 | Schachter | 29/628 |
| 4,044,888 | 8/1977 | Schachter | 205/330 |
| 4,054,238 | 10/1977 | Lloyd et al. | 29/628 |

*Primary Examiner*—Douglas J. Drummond
*Attorney, Agent, or Firm*—John W. Fisher

[57] ABSTRACT

Apparatus and a method are disclosed for affixing bondable finger contacts (102) to a printed circuit board (330). The bondable finger contacts, as supplied, are wound on a reel (301) in a virtually continuous fashion. Each of the contacts is carried between a pair of attached support carriers (105 and 106). At a first station the support carriers are severed (305, 306, 307, 313, 314 and 315) from a selected group of contacts but these contacts remain interconnected and supported by a strip of protective adhesive tape (108). Thereafter the contacts are transferred (310, 311 and 312) to a second station where they are brought into engagement with an aligned printed circuit board (331, 332, 333, 334 and 337). Application of heat and pressure to thermally curable adhesive (109) on the contacts bonds (335, 336 and 339) the contacts to the circuit board. During these operations the protective tape covers the contact area thereby reducing the possibility of contact area contamination and damage.

17 Claims, 5 Drawing Figures

APPARATUS AND METHOD FOR AFFIXING BONDABLE FINGER CONTACTS TO A PRINTED CIRCUIT BOARD

CROSS-REFERENCE TO RELATED APPLICATION

This application is related to the copending application of V. L. Brown, W. H. Greenwood and G. L. Griffith Ser. No. 891,038, filed Mar. 28, 1978, entitled "Apparatus and Method for Making Bondable Finger Contacts" and assigned to the same assignee as this application.

BACKGROUND OF THE INVENTION

1. Technical Field of the Invention

This invention relates to electrical contacts and, more particularly, to apparatus and a method for affixing bondable finger contacts to printed circuit boards.

2. Description of the Prior Art

A conventional method for electrically connecting plug-in printed circuit boards to mating backplane connectors utilizes patterned and plated fingers at the board edge. These fingers are usually an extension of the circuit pattern. They are plated with a sequence of metallization layers to provide low contact resistance between the mating parts of the connector over the circuit life.

Another method for providing finger contacts on printed circuit boards is disclosed in H. E. Spooner et al U.S. Pat. No. 3,396,461, issued Aug. 13, 1968. In Spooner et al the contact elements are carried on a common support strip. The strip is positioned over the conductor patterns on the circuit board thereby bringing the contact elements into alignment with the conductor patterns. The contact elements are then bonded to the conductor patterns by welding or soldering after which the common support strip is removed.

Still another method for terminating printed circuit boards utilizes a double-sided piece of adhesive tape to fasten a connector along the edge of the board. This approach to board termination is disclosed in R. D. Nelson U.S. Pat. No. 3,704,515 issued Dec. 5, 1972. In Nelson the connector contacts are bent at right angles to facilitate engagements with apertures in the printed circuit board. Once the contacts are inserted into the apertures, they are held securely in place by solder.

A somewhat related method for terminating circuit modules is disclosed in C. W. Wallach U.S. Pat. No. 4,044,201, issued Aug. 23, 1977. In Wallach a lead frame assembly includes a pair of spaced-apart, parallel carrier strips with a plurality of collapsible rungs extending between the strips at regular intervals along its length. The rungs are collapsed inwardly to seat against the sides of the circuit module which is positioned between the ends of the leads. After seating, the lead ends are soldered to metallized surfaces on the module. Following bending of the leads, the carrier strips and rungs are cut away.

Apparatus for attaching multiconductor flat cable to an electrical connector is disclosed in W. R. Over et al U.S. Pat. No. 3,938,246, issued Feb. 17, 1976. The apparatus employs a movable ram which moves through multiple strokes to perform all of the necessary steps. A movable connector holder is utilized so that cables may be attached to opposite faces of the connector by using a single, movable ram. The contacts used in effecting this type of termination are manufactured by punching a thin strip of metal to form individual contacts. Plastic carrier strips are applied to opposite edges of the contacts to provide support after the contacts are severed from their metallic support strip.

A number of problems exist in the above methods for mounting prefabricated finger contacts. In particular, for extremely densely patterned printed circuit boards where the spacing between adjacent conductor patterns might be on the order of 62.5 mils, prefabricated fingers have to be retained in relatively precise alignment during attachment. In view of this conductor spacing it is oftentimes necessary to put contact fingers on both sides of the board even though the circuit pattern appears only on one side of the board. None of the aforementioned references addresses these problems. Moreover, in those methods where the carrier support strip is severed following the bonding operation, both the contacts and the board are susceptible to damage along the leading edge. This is especially true where the boards are uneven.

In order to circumvent these problems, we have developed apparatus and a method for affixing bondable finger contacts to a printed circuit board which facilitates increasing the number of available contact positions by mounting finger contacts on both sides of the printed circuit board. By virtue of this approach access is gained to a single-sided circuit from both sides of the printed circuit board along the edge mounted contacts. This solution is attractive because finger contact alignment is controllable during the bonding operation. In addition, the possibility of board and contact damage caused by sharp contact edges is greatly reduced.

Additional benefits to be derived from this approach to solving the above-noted problems are that the contact metal plated areas of the contacts are protected from damage during installation. Furthermore, the finger contacts are mounted in such a way that individual contacts which may become damaged during subsequent handling or use of the printed circuit board may be advantageously individually repaired.

SUMMARY OF THE INVENTION

The foregoing results are achieved in an illustrative embodiment of a method and apparatus for affixing bondable finger contacts to a printed circuit board. In accordance with the method, finger contacts are manufactured by forming individual contacts out of a strip of electrically conductive material. These contacts are interconnected by at least one support carrier and have an adhesive tape affixed to one side and a coat of thermally curable adhesive applied to an opposite side. The preferred method for manufacturing these contacts in this form is disclosed in the copending application of V. L. Brown et al, Ser. No. 891,038, filed Mar. 28, 1978, and assigned to the same assignee as this application. A virtually continuous strip of these contacts is fed to a first station at which the support carrier is severed from the finger contacts. Thereafter the finger contacts supported by the tape, are transferred to a second station where they are aligned for engagement with the printed circuit board. The aligned finger contacts are then bonded to the circuit board.

Accordingly, it is an advantage of one embodiment of the present invention that the carrier strips are severed from the finger contacts prior to their application to the board. This severing of the carrier support strip prior to bonding reduces the possibility of board and contact damage caused by sharp contact edges.

Another advantage of one embodiment is that the plated contact area of the finger contacts are protected by the tape during installation. In addition, the tape holds individual finger contacts in alignment during bonding to the printed circuit board.

Still another advantage of one embodiment is that the bondable finger contacts can be mounted on both sides of a printed circuit board thereby increasing the number of available contact positions for densely patterned circuits.

BRIEF DESCRIPTION OF THE DRAWINGS

The aforementioned advantages of the invention, as well as other advantages, will be better understood upon consideration of the following detailed description and appended claims taken in conjunction with the attached drawings of an illustrative embodiment in which:

DETAILED DESCRIPTION

Figure 1:
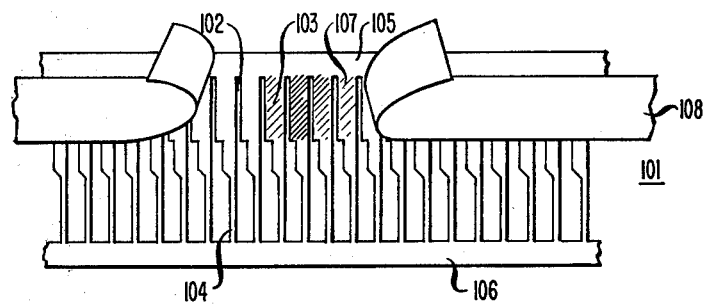
FIG. 1 illustrates a section of metallic web formed to produce a plurality of bondable finger contacts which have their plated contact area covered by a protective tape.

A section of a web 101 containing a plurality of bondable finger contacts 102 is illustrated in FIG. 1. Web 101 is comprised of a virtually continuous, flat strip of electrically conductive material either punched or chemically etched to form finger contacts 102. Each of contacts 102 is formed to have a relatively broad contact portion 103 and a somewhat narrower tail portion 104. During the forming operation contacts 102 are held adjacent to one another on web 101 by carrier strips 105 and 106.

Following the forming operation, the relatively broad contact portion 103 is plated with contact metal 107, as illustrated on some of contacts 102 shown in FIG. 1. To provide protection, support and compliance during subsequent handling and bonding operations, contact portion 103 is covered with protective tape 108.

Figure 2:
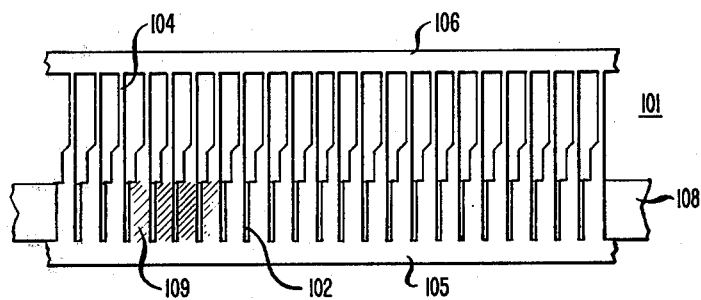
FIG. 2 illustrates the opposite side of the metallic web wherein individual contacts have a thermally curable adhesive applied thereto.

The reverse side of web 101, shown in FIG. 1, is illustrated in FIG. 2. Specifically shown is a partially cured, film of adhesive 109 which covers the underside of contact portion 103. Adhesive 109 is applied as a liquid during the manufacture of web 101. Adhesive 109 dries to a hard, nonsticky film following its application.

This virtually continuous web 101 of finger contacts 102 protected by tape 108 and carrying adhesive 109 is rolled on a reel and shipped by a manufacturer to a user facility for assembly to a printed circuit board. One method for applying contacts 102 to the circuit board uses solderable tail portion 104 for insertion into plated-through holes in the board. Paths from these plated-through holes lead away from the board edge to other circuits on the printed circuit board. It should be noted, however, that no patterning of any kind is required in the immediate finger contact area. More complete details as to the method of manufacture of bondable finger contacts 102 is set forth in the copending application of V. L. Brown et al Ser. No. 891,038, filed Mar. 28, 1978, and assigned to the same assignee as this application.

Figure 3:
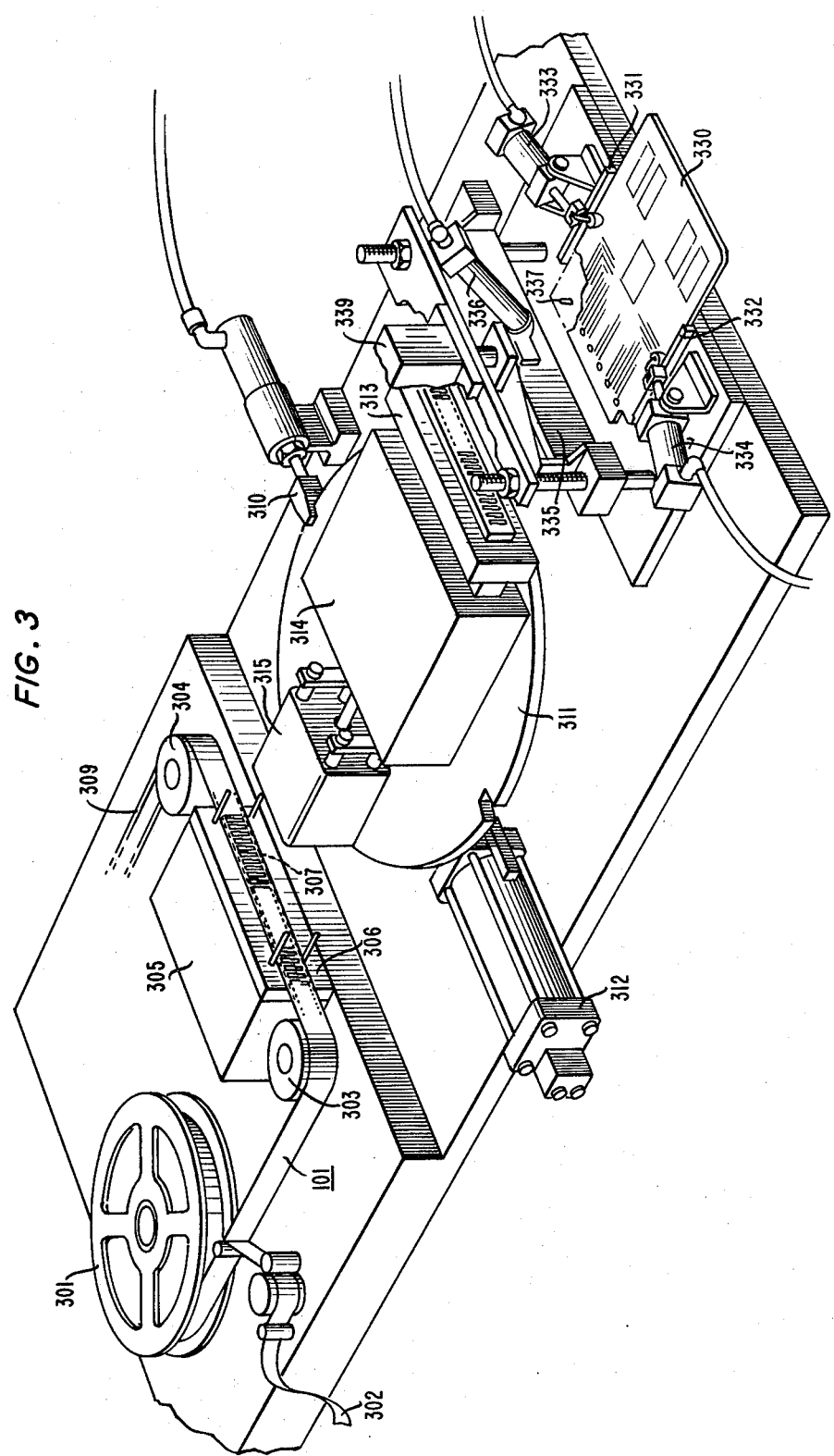
FIG. 3 illustrates apparatus for cutting at one station a predetermined number of finger contacts from a reel of such contacts while simultaneously severing the carrier support strips, for transferring the severed group of contacts to another station where they are brought into alignment with a prealigned printed circuit board, and for bonding the contacts to the board by the application of heat and pressure.

Application of bondable finger contacts 102 to a printed circuit board includes the steps of severing contacts 102 from support carriers 105 and 106, aligning severed contacts 102 with the printed circuit board, and then bonding them to the board. Apparatus for effecting these operations is shown in FIG. 3. In general, the apparatus can be viewed as comprising three subsystems: the first subsystem is for web handling; the second subsystem is for transferring finger contacts 102; and the third subsystem is for bonding contacts 102 to the board.

As indicated previously, a virtually continuous web 101 of bondable finger contacts 102 is received from the manufacturer on a reel, such as reel 301. Layers of finger contacts 102 on reel 301 are separated from one another by a paper separator strip 302. As web 101 is drawn off reel 301, separator strip 302 is pulled off in one direction while web 101 passes around an idler 303. The pulling force to draw web 101 from reel 301 is provided by incremental motor 304.

During the passage of web 101 around idler 303 and incremental motor 304, web 101 is brought into position adjacent to die support block 305. Affixed to die support block 305 is changeable die 306. Die 306 is selected on the basis of the number and size of bondable finger contacts 102 which are to be affixed to printed circuit board 330. A pressure plate 307 is positioned within changeable die 306. This apparatus essentially constitutes the web handling subsystem.

Figure 5:
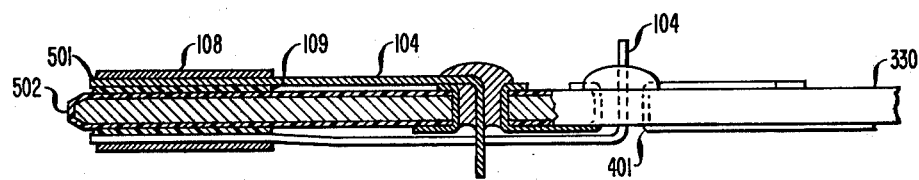
FIG. 5 illustrates the mechanical bonding and electrical connection of the bonded finger contacts to the printed circuit board.

Upon the application of a pneumatic control signal to the transfer subsystem wedge lock 310 is released permitting precision rotary table 311 to be rotated by rotary actuator 312 from a first position as shown in FIG. 3 to a second position approximately 180 degrees from that illustrated. The rotation of table 311 brings punch and vacuum chuck 313, which is held by guide block 314, into alignment opposite changeable die 306. In this position the actuation of punch actuator 315 drives punch and vacuum chuck 313 into engagement with changeable die 306. As a result of this operation, support carriers 105 and 106 are severed from bondable finger contacts 102. It should be noted, that by virtue of the selection of an appropriate punch 313 and changeable die 306, the desired number and size of bondable finger contacts 102 can be advantageously severed from web 101. It should be noted that the punching operation is effected such that resulting burrs are oriented for embedding into a surface of printed circuit board 330 to provide a generally smooth transition between contact portion 103 and circuit board edge 502 as shown in FIG. 5.

Following the severing operation, carrier strips 105 and 106 are drawn off as strip scrap 309 by incremental motor 304. Since punch 313 also includes a vacuum chuck, the selected number of bondable finger contacts 102 are held by the vacuum adjacent to punch 313.

A further application of pneumatic control again releases wedge lock 310 permitting rotary table 311 to be rotated approximately 180 degrees back to the position shown in FIG. 3. Throughout the transfer and thereafter finger contacts 102 are supported in alignment and are protected by tape 108.

At this point, printed circuit board 330 is inserted between and aligned by guides 331 and 332, aligned by guide pins 337, and clamped in accurate position by pneumatic clamps 333 and 334. With printed circuit board 330 in position, punch actuator 314 is again actuated, advancing punch and vacuum chuck 313 to a position adjacent to bonding actuator support member 335. Through vacuum transfer the assembly of bondable finger contacts 102 supported by tape 108 is passed from punch and vacuum chuck 313 to support member 335. This positions tails 104 of finger contacts 102 essentially perpendicular to a plane containing printed circuit board 330.

Figure 4:
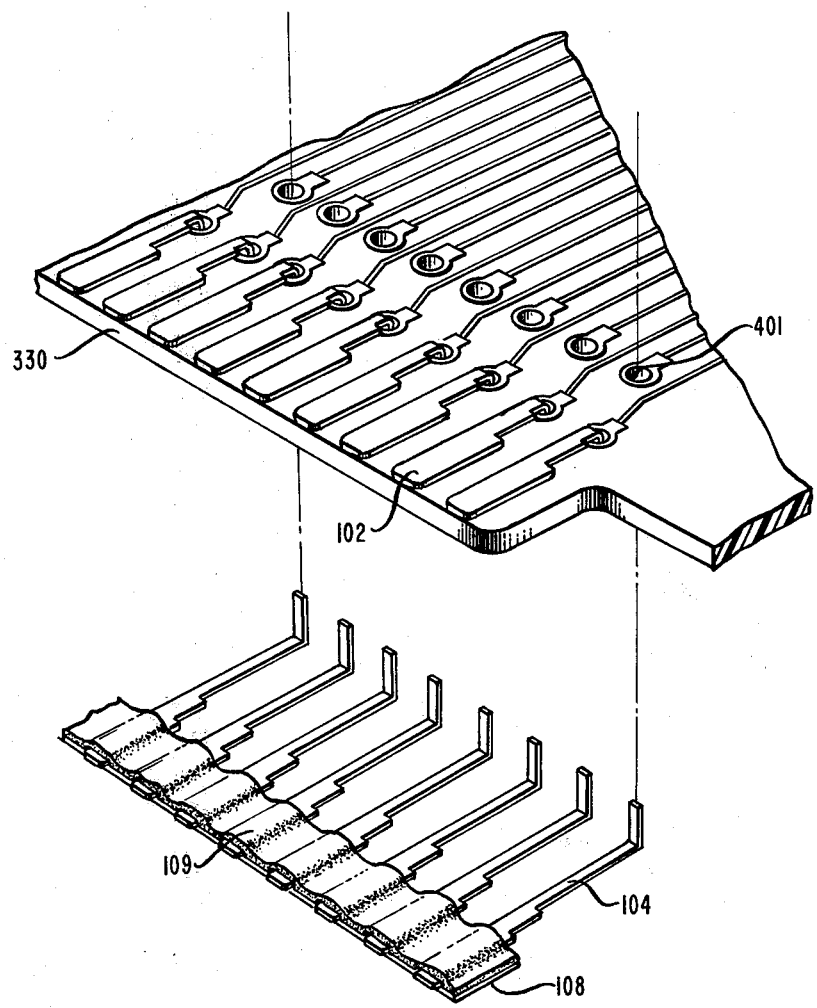
FIG. 4 illustrates the mounting of individual finger contacts on opposite sides of a printed circuit board.

Bonding actuator support member 335 is lowered by ram driver 339, inserting tails 104 into a linear array of spaced-apart plated-through holes 401, as shown in FIG. 4. Because of tape 108, the relative alignment between contacts 102 is maintained during insertion. Thereafter bonding actuator support member 335 is rotated through approximately a 90 degree angle bending contact portions 103 of finger contacts 102 into planar alignment with printed circuit board 330. Upon the application of heat and pressure supplied by bonding actuator 336, adhesive 109 on bondable finger contacts 102 causes contacts 102 to adhere along the edge of printed circuit board 330. With finger contacts 102 bonded to circuit board 330, bonding actuator support member 335 is raised by ram driver 339 and circuit board 330 is released by releasing pneumatic clamps 333 and 334. The aforementioned apparatus constitutes the bonding subsystem.

As shown in FIG. 4, by virtue of the length of contact tail portion 104, finger contacts 102 can be advantageously applied to both sides of printed circuit board 330 thereby increasing the number of available contact positions thereon. It should be noted that this contact mounting arrangement in conjunction with plated-through holes 401, as shown in FIG. 4, permits access to be gained to a single-sided circuit from both sides of printed circuit board 330. Moreover, as a result of having severed carrier strips 105 and 106 prior to the application of finger contacts 102 to circuit board 330, production of sharp edges which could result in possible board and contact damage along the leading edge of circuit board 330 is greatly reduced.

Following the insertion of bondable finger contacts 102 into plated-through holes 401 in circuit board 330, as shown in FIG. 4, and the bonding of finger contacts 102 to circuit board 330, electrical connection between finger contacts 102 and conductor patterns on circuit board 330, as shown in FIG. 5, can be advantageously achieved with either wave soldering techniques or reflow solder techniques.

In all cases it is to be understood that the above-described embodiment is illustrative of but a small number of many possible specific embodiments which can represent applications of principles of the invention. Numerous and various other embodiments can be devised readily in accordance with these principles by those skilled in the art without departing from the spirit and scope of the invention.

We claim:

1. A method for affixing bondable finger contacts to a printed circuit board wherein the finger contacts are formed out of a strip of electrically conductive material and interconnected by at least one support carrier, the finger contacts having an adhesive tape affixed to one side and a coat of thermally curable adhesive on an opposite side, CHARACTERIZED IN THAT the method includes the steps of severing at a first station said support carrier;
transferring said finger contacts supported by said tape to a second station;
aligning at said second station said circuit board for engagement with said adhesive coating on said finger contacts; and
bonding said aligned finger contacts to said circuit board.

2. The method in accordance with claim 1 wherein said severing step further includes the steps of:
holding said tape supported finger contacts in juxta-position with a die;
engaging a mating punch with said die; and
transferring by vacuum said tape supported severed contacts to said punch.

3. The method in accordance with claim 1 wherein said transferring step further includes the steps of:
disengaging an air driven wedge lock holding a rotary table; and
rotating said table through a predetermined arc thereby moving said finger contacts from said first station to said second station.

4. The method in accordance with claim 1 wherein said aligning step further includes the steps of:
actuating a plurality of guide pins for engagement with a corresponding plurality of apertures near one end of said circuit board; and
clamping with air actuated members said circuit board at said second station.

5. The method in accordance with claim 1 further including the steps of:
inserting end portions of said finger contacts into a linear array of spaced-apart apertures in said circuit board; and
bending at approximately right angles said contact portions so as to bring contact portions of said finger contacts into juxtaposition with an end of said circuit board.

6. The method in accordance with claim 1 wherein the severing step includes:
punching said finger contacts such that resulting burrs are oriented for embedding into a surface of said printed circuit board.

7. A method for affixing bondable finger contacts to a printed circuit board including the steps of:
feeding to a first station a comb-like assembly of spaced-apart, electrically conductive metallic finger contacts having at least one support carrier along a side, a support edge affixed to contact portions on one side of said contacts and a thermally curable adhesive on an opposite side of said contact portions;
severing at said first station said support carrier from said assembly;
transferring said finger contacts supported by said support tape to a second station;
aligning at said second station said circuit board for engagement with said finger contacts; and
bonding said finger contacts to said aligned circuit board.

8. The method in accordance with claim 7 further including the steps of:

inserting end portions of said finger contacts into a linear array of spaced-apart apertures near an end region of said circuit board, and bending said contact portions at approximately right angles so as to bring said contact portions into juxtaposition with said end region of said circuit board.

9. The method in accordance with claim 7 further including the step of:

soldering said end portions of said finger contacts into said linear array of spaced-apart apertures near said end region of said circuit board.

10. Apparatus for affixing bondable finger contacts to a printed circuit board, said finger contacts being formed out of a strip of electrically conductive material and interconnected by at least one support carrier, said finger contacts having an adhesive tape affixed to one side and a coat of thermally curable adhesive on an opposite side, CHARACTERIZED IN THAT the apparatus includes means for severing at a first station said support carrier, means for transferring said finger contacts supported by said tape to a second station, means for aligning at said second station said printed circuit board for engagement with said adhesive coated, tape supported contacts, and means for bonding said aligned contacts to said circuit board.

11. The apparatus in accordance with claim 10 wherein said severing means includes a die, means for transporting a web carrying said finger contacts to a position juxtaposed said die, a punch, and means for selectively actuating said punch when said punch is positioned adjacent said die.

12. The apparatus in accordance with claim 11 wherein said transferring means includes a rotary table, means for locking said rotary table in a first position wherein said punch is oppositely positioned from said die, means for selectively disengaging said locking means; and means, responsive to said disengaging means, for rotating said table from said first position to a second position wherein said punch is positioned adjacent said die.

13. The apparatus in accordance with claim 10 wherein said aligning means comprises:

first and second guides for limiting the lateral movement of said printed circuit board, a plurality of actuable guide pins for limiting the forward movement of said printed circuit board, said guide pins engaging apertures along an edge of said printed circuit board, and means for clamping said printed circuit board in an aligned position defined by said guides and said guide pins.

14. The apparatus in accordance with claim 10 further including:

means for holding a severed assembly of said finger contacts, means for advancing said holding means so as to insert tail portions of said finger contacts into plated-through apertures in said printed circuit board, and means for bending contact portions of said finger contacts at approximately right angles so that said contact portions are brought into planar alignment with said printed circuit board.

15. Apparatus for affixing bondable finger contacts to a printed circuit board, said finger contacts being formed out of a strip of electrically conductive material and interconnected by at least one support carrier, said finger contacts having an adhesive tape affixed to one side and a coat of thermally curable adhesive on an opposite side, CHARACTERIZED IN THAT, the apparatus includes means for transporting said strip of finger contacts to a first station;

means, at said first station, for severing said support carrier from a predetermined number of said finger contacts;

means for transferring said predetermined number of said severed finger contacts supported by said tape to a second station;

means for aligning at said second station said printed circuit board for engagement with said adhesive coated side of said finger contacts, and means for bonding said aligned contacts to said aligned circuit board.

16. The apparatus in accordance with claim 15 wherein said transporting means comprises an incremental motor.

17. A method for affixing bondable finger contacts to a printed circuit board including the steps of:

feeding to a first station a comb-like assembly of spaced-apart, electrically conductive metallic finger contacts having at least one support carrier along a side, a support tape affixed to contact portions on one side of said contacts and a thermally curable adhesive on an opposite side of said contact portions;

severing at said first station said finger contacts from said support carrier, said severing operation effected in such a way that any resulting burrs are oriented for embedding into a surface of said printed circuit board;

transferring said finger contacts supported by said support tape to a second station;

aligning at said second station said circuit board for engagement with said finger contacts; and bonding said finger contacts to said aligned circuit board.

* * * * *

UNITED STATES PATENT AND TRADEMARK OFFICE
CERTIFICATE OF CORRECTION

PATENT NO. : 4,178,678

DATED : December 18, 1979

INVENTOR(S) : Leo Carrillo and Thomas C. Madden

It is certified that error appears in the above–identified patent and that said Letters Patent are hereby corrected as shown below:

Column 6, line 55, "edge" should read --tape--.

Signed and Sealed this

Seventeenth Day of June 1980

[SEAL]

Attest:

SIDNEY A. DIAMOND

Attesting Officer

Commissioner of Patents and Trademarks